United States Patent [19]

Chieli

[11] Patent Number: 4,904,889
[45] Date of Patent: Feb. 27, 1990

[54] CIRCUIT FOR DRIVING ELECTRONIC DEVICES WITH A LOW SUPPLY VOLTAGE

[75] Inventor: Davide Chieli, Milan, Italy

[73] Assignee: SGS-Thomson Microelectronics S.r.l., Agrate Brianza, Italy

[21] Appl. No.: 277,077

[22] Filed: Nov. 28, 1988

[30] Foreign Application Priority Data

Dec. 3, 1987 [IT] Italy .............................. 22878 A/87

[51] Int. Cl.$^4$ .......................... H03K 7/16; H03K 9/06
[52] U.S. Cl. ................................. 307/570; 307/571; 307/26.3; 307/253; 307/360
[58] Field of Search ..................... 307/570, 296.3, 571, 307/253, 360

[56] References Cited

U.S. PATENT DOCUMENTS 4,480,200 10/1984 Tan et al. ........................... 307/360
4,524,291 6/1985 Lehning ............................. 307/360

FOREIGN PATENT DOCUMENTS 0013021 1/1983 Japan .................................. 307/570

OTHER PUBLICATIONS

IBM Tech. Disc. Bul., vol. 14, No. 4, 9/71, "Analog Switch", Buhler

Primary Examiner—Stanley D. Miller
Assistant Examiner—Margaret Rose Wambach
Attorney, Agent, or Firm—Guido Modiano; Albert Josif

[57] ABSTRACT

A driving circuit comprising a low-voltage power supply line, a MOS transistor having a gate terminal and a drain terminal connected to a load and a control stage connected to the power supply line and to the gate terminal of the MOS transistor. In order to allow the MOS transistor to be switched on even when the voltage of the power supply line is lower than the threshold voltage of the MOS transistor, the driving circuit comprises a bipolar transistor connected in parallel to the MOS transistor and a voltage multiplier circuit connected between a common terminal of the MOS and bipolar transistors and the control stage. The control stage comprises comparators adapted to initially switch on the bipolar transistor so as to feed the multiplier circuit, which is thus capable of generating a voltage higher than the available supply voltage, and to subsequently switch off the bipolar transistor and switch on the MOS transistor when the voltage generated by the voltage multiplier has reached at least the threshold voltage of the MOS transistor.

8 Claims, 1 Drawing Sheet

CIRCUIT FOR DRIVING ELECTRONIC DEVICES WITH A LOW SUPPLY VOLTAGE

BACKGROUND OF THE INVENTION

The present invention relates to a circuit for driving electronic devices with a low supply voltage. In particular the invention relates to a circuit for driving a MOS transistor with a low supply voltage which is per se insufficient to drive said MOS transistor.

As is known, the use of switching MOS transistors has some advantages with respect to the use of bipolar transistors. In particular MOS transistors operate at higher switching frequencies because of the absence of the charge storage phenomena, and the driving power of MOS transistor is lower.

In particular this second aspect can be very important when operating with high switching currents.

Despite these advantages it is not always possible to use MOS transistors to drive electrical loads or other circuits, since the gate terminal of MOS transistors requires higher driving voltages than the base terminal of bipolar transistors. In fact, as is known, DMOS transistors for example require a gate driving voltage higher than 3 V, whereas bipolar transistors require a base voltage of 0.7 V.

This is a severe limitation for the use of MOS transistors in systems fed at low voltage.

For the sake of clarity, reference should be made to FIG. 1, illustrating an exemplifying diagram of a usual circuit employing a MOS transistor to drive an inductive load. As can be seen, the MOS transistor, indicated by M1, is connected in series to an inductor L arranged between M1 and the supply voltage $V_{IN}$. The circuit furthermore comprises a control stage 1 also connected to the supply voltage and to the gate terminal of the transistor M1 so as to drive said MOS transistor, said stage 1 feeding a gate voltage variable according to the intended switching sequences.

This circuit can operate only if the supply voltage $V_{IN}$ is at least greater than the threshold voltage $V_T$ of the MOS transistor (which, as mentioned, is equal to 3 V for a DMOS transistor). If the input supply voltage $V_{IN}$ is lower, the diagram of FIG. 1, cannot be used and the MOS transistor should be replaced with a bipolar transistor, thus renouncing the above mentioned advantages related to the high switching frequencies and to the low power consumption required to drive the transistor.

SUMMARY OF THE INVENTION

Given this situation, the aim of the present invention is to provide a circuit for driving electronic devices fed at low voltage, capable of ensuring the driving of said electronic device, typically a MOS transistor, even if the supply voltage value is lower than the minimum driving voltage of said electronic device.

Within this aim, a particular object of the present invention is to provide a driving circuit for MOS transistors which operates even with a supply voltage which is lower than the threshold voltage of said MOS transistor, so as to fully exploit the advantages of the MOS technology, due to the possibility of using higher switching frequencies and of reducing the driving power consumption with respect to the use of bipolar devices.

Another object of the present invention is to provide a driving circuit which is simple in concept and easy to manufacture, so as to have low manufacture costs. Not least object of the present invention is to provide a driving circuit which by virtue of its structural and functional characteristics is capable of giving the greatest assurances of safety and reliability in use.

BRIEF DESCRIPTION OF THE DRAWINGS

This aim, the objects mentioned and others which will become apparent hereinafter are achieved by a circuit for driving electronic devices fed at low voltage as defined in the accompanying claims.

Further characteristics and advantages of the invention will become apparent from the description of a preferred but not exclusive embodiment, illustrated only by way of non-limitative example in the accompanying drawings, wherein.

DESCRIPTION OF THE PREFERRED EMBODIMENTS

Figure 1:
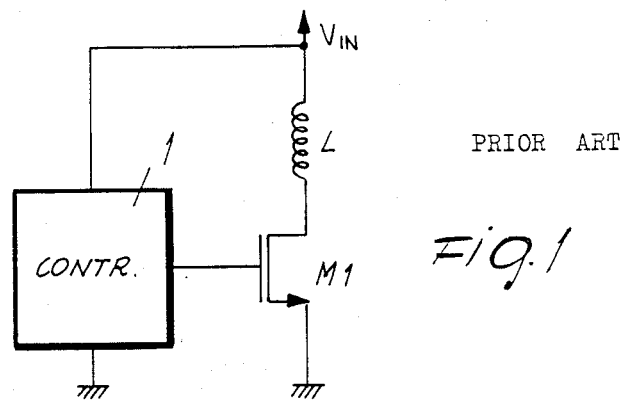
FIG. 1 is a general circuit diagram of a known driving circuit.

FIG. 1 is not described hereinafter; reference is made to the above for its description.

Figure 2:
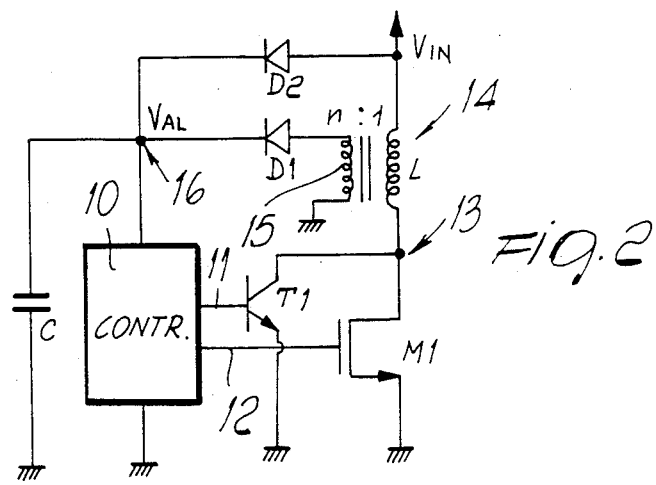
FIG. 2 is a general circuit diagram of the driving circuit according to the invention.

With reference thus to FIG. 2, the driving circuit according to the invention comprises a bipolar transistor T1 connected in parallel to the MOS transistor M1. In detail, the collector terminal of T1 is connected to the drain terminal of M1, while the emitter terminal of T1 is connected to the source terminal of M1 and to the ground, defining a reference potential line. The base terminal 11 and gate terminal 12 of the transistors T1 and M1 are connected to a control circuit 10 adapted to appropriately enable and disable the transistors T1 and M1 as will be explained in further detail hereinafter. The common point 13 between the collector of T1 and the drain of M1, illustrated in FIG. 2, is connected to a terminal of an inductive load L connected with its other terminal to the input supply voltage $V_{IN}$ defining a further reference potential line. The inductive load L, according to the illustrated embodiment of the invention, is a part of a transformer 14, the inductive load L constituting its primary winding, its secondary winding 15 having a winding ratio n:1 sufficient to generate the driving voltage of the MOS transistor M1. Therefore the transformer 14 defines a voltage multiplier circuit having a high voltage output connected to the control circuit 10 at a point 16. In detail, the secondary winding 15 is connected between the ground and the anode of a diode D1 connected with its cathode to the point 16 having the potential $V_{AL}$. The point 16 is furthermore connected to the input supply voltage $V_{IN}$ through a decoupling diode D2 and to a blocking capacitor C arranged between the point 16 and the ground.

The operation of the circuit of FIG. 2 is the following. Assume the input voltage $V_{IN}$ is not sufficient to switch on the MOS transistor M1 but is sufficient to switch on the bipolar transistor. In this case when the circuit is switched on the control circuit immediately feeds and thus switches on the bipolar transistor T1 which, causing a current to flow across the inductive load L, allows the transformer to charge the capacitor C through the diode D1. Thus capacitor C charges up to the voltage $nV_{IN}$. If the winding ratio n of the transformer is sufficiently large, the voltage $nV_{IN}$ is sufficient to drive the MOS transistor. Consequently, as soon as the voltage $V_{AL}$ (which is about $nV_{IN}$) reaches the threshold voltage of the MOS transistor M1, the control circuit switches off the bipolar transistor and switches on M1. Once the circuit has been switched on, it is self-sustaining, and the control circuit 10 sends the programmed sequence of control impulses to the gate 12 of M1 according to the desired application.

It should be noted that the diode D2 is used initially to feed the control stage 10 with the input supply voltage $V_{IN}$ and that it acts as a decoupler when the voltage on the capacitor has reached a higher value than the input supply voltage.

Figure 3:
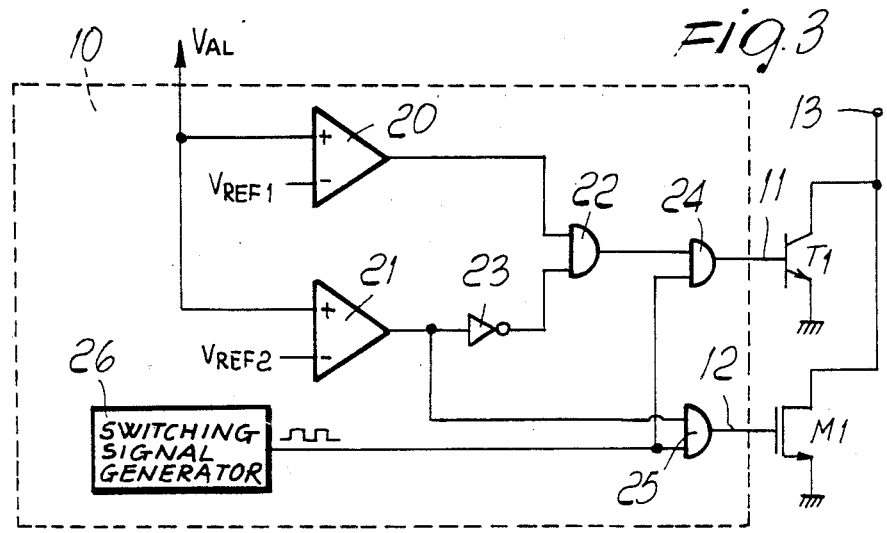
FIG. 3 is a general electric diagram of the control stage provided in FIG. 2.

An example of the control stage of FIG. 2 is schematically illustrated in FIG. 3. As can be seen, the control stage 10 of FIG. 3 comprises a pair of comparators 20 and 21 both adapted to receive the multiplied voltage generated at the output of said transformer 14, at their positive input, and a respective reference voltage $V_{REF1}$, $V_{REF2}$, at their negative input. The output signal of the comparator 20 is sent to the first input of an AND gate 22, said AND gate receiving at its second input the output signal of the comparator 21, appropriately inverted by inverter 23. The output signal of the AND gate 22 is fed to the first input of a further AND gate 24, said further AND gate receiving at its second input the switching signal generated by a control signal generator 26. The output signal of the gate 24 is sent directly to the base of the transistor T1. The output signal of the comparator 21 is also sent, non inverted, to another logical AND gate 25 which also receives at its input the signal of the control signal generator 26. The output signal of the AND gate 25 is then sent to the gate terminal 12 of the MOS transistor M1.

The voltage $V_{REF1}$ has a low value able to ensure in any case the driving of the base of the bipolar transistor T1, while the voltage $V_{REF2}$ has a greater value, at least equal to the threshold voltage of the MOS transistor M1, preferably equal to the driving or switching on voltage of the gate of M1. Said voltage $V_{REF2}$ can be directly obtained from the voltage $V_{AL}$, as $V_{AL}$ is at this stage multiplied to a value sufficient to drive the MOS transistor, or can represent a preset fraction of the driving voltage of said MOS transistor, in which case said voltage $V_{REF2}$ is compared with a fraction of the output voltage $V_{AL}$ of the transformer, conveniently reduced for example by means of a divider.

The operation of the circuit illustrated in FIG. 3 is very simple and is clearly apparent from the diagram. In fact when the circuit switches on, as soon as the voltage $V_{AL}$ has exceeded the voltage $V_{REF1}$ the comparator 20 sends a logical "1" signal to the AND gate 22, said gate being enabled at this stage by a logical "1" signal generated by the inverter 23. The bipolar transistor T1 is consequently driven by the AND gate 24 according to the switching sequence of the control signal of the generator 26. As mentioned, switching on of T1 allows current to flow across L and therefore the output voltage $V_{AL}$ of the transformer 14 to rise. Consequently, when the voltage $V_{AL}$ has reached at least the threshold voltage of the MOS transistor M1, the comparator 21 switches, disabling the gate 22 and feeding the gate 25 with the voltage required for driving the gate of M1. At this point the transistor M1 is capable of driving the load by itself according to the control sequence generated by the generator 26.

As can be seen from the above description, the invention fully achieves the intended aims. A driving circuit has in fact been provided which allows an electronic device requiring a high driving voltage, typically a MOS transistor, to be switched on even when the external supply voltage is lower than the minimum switching on value. In this manner it is possible to fully exploit the advantages of the MOS transistor as to speed and low consumption or the advantages shown by the employed electronic device. The circuit is simple in concept and easy to manufacture, and in particular the fact is stressed that the provision of the transformer 14 does not entail a great expense or cost increase if the inductive element already present in the load circuit can be used.

The circuit is furthermore reliable in all operating conditions.

It should be furthermore noted that the dimensions of the bipolar transistor may be much smaller than those of the MOS transistor, since said bipolar transistor is supplying only the power required by the control circuit, while the said MOS transistor is supplying the load power.

The invention thus conceived is susceptible to numerous modifications and variations. In particular, the fact is again stressed that though the illustrated example refers to the driving of a MOS transistor for supplying power to an inductive load, the same inventive concept can be used in low voltage fed systems, which initially need a higher turn on voltage, but are then able to generate suitable voltages. For example, if an inductive load is not available, the voltage multiplier circuit (transformer 14) can be replaced with a capacitive voltage converter able of generating the required start voltage. However this step is complicating the electronic circuit.

The diode D2 can furthermore be replaced with a resistor if a higher energy dissipation due to the return of current from the capacitor C to the power supply $V_{IN}$ is acceptable.

Furthermore all the components may be replaced with other technically equivalent ones.

I claim:

1. A circuit for driving electronic devices with a low supply voltage, comprising a first and a second reference potential lines, a first and a second electronic devices, said first and second electronic devices having first terminals connected together and to said first reference potential line, second terminals connected together and to said second reference potential line and own control terminals, a control stage connected between said first and second reference potential lines and having a first and a second control outputs connected respectively to said control terminals of said first and second electronic devices, a voltage multiplier circuit connected between said first terminals of said first and second electronic devices and said first reference potential line, said voltage multiplier circuit having a high voltage output generating an output voltage and being connected to said control stage, said control stage including means for generating a first drive signal fed to said control terminal of said second electronic device when said output voltage of said voltage multiplier circuit is lower than a threshold voltage and for generating a second drive signal fed to said control terminal of said first electronic device when said output voltage is higher than said threshold voltage.

2. A circuit for driving electronic devices with a low supply voltage, comprising a first reference potential line set at a first potential, a second reference potential line set at a second potential, lower than said first potential, a first electronic device having a first switching on threshold higher than said first potential, said first electronic device defining a first terminal connected to said first reference potential line, a second terminal connected to said second reference potential line and a first control terminal, a second electronic device having a second switching on threshold lower than said first potential and higher than said second potential, said second electronic device defining a third terminal connected to said first reference potential line and to said first terminal, a fourth terminal connected to said second reference potential line and said second terminal and a second control terminal, a control stage connected between said first and second reference potential lines and having a first and a second drive outputs connected respectively to said first and second control terminals of said first and second electronic devices, a voltage multiplier circuit connected between said first and second reference potential lines in series with said first and second electronic devices, said voltage multiplier circuit having a high voltage output connected to said control stage and generating an output voltage, said control stage including means for detecting said output voltage and generating a first drive signal fed to said second control terminal of said second electronic device when said output voltage is lower than said first switching on threshold and for generating a switch off signal fed to said control terminal of said second electronic device and a second drive signal fed to said first control terminal of said first electronic device when said output voltage is higher than said first switching on threshold.

3. A circuit for driving electronic devices with a low supply voltage, comprising a first reference potential line set at a first potential, a second reference potential line set at a second potential, lower than said first potential, a first electronic device having a first switching on threshold higher than said first potential, said first electronic device defining a first terminal connected to said first reference potential line, a second terminal connected to said second reference potential line and a first control terminal, a second electronic device having a second switching on threshold lower than said first potential and higher than said second potential, said second electronic device defining a third terminal connected to said first reference potential line and to said first terminal, a fourth terminal connected to said second reference potential line and said second terminal and a second control terminal, a control stage connected between said first and second reference potential lines and having a first and a second drive outputs connected respectively to said first and second control terminals of said first and second electronic devices, a voltage multiplier circuit having a portion connected between said first and third terminals of said first and second electronic devices and said first reference potential line, said portion having a voltage drop applied thereto, said voltage multiplier circuit having a high voltage output connected to said control stage and generating an output voltage higher than said voltage drop, said control stage including means for detecting said output voltage and generating a first drive signal fed to said second control terminal of said second electronic device when said output voltage is lower than said first switching on threshold and for generating a switch off signal fed to said second control terminal of said second electronic device and a second drive signal fed to said first control terminal of said first electronic device when said output voltage is higher than said first switching on threshold.

4. A circuit according to claim 3, wherein said first electronic device is a MOS transistor having gate, drain and source terminals, and said second electronic device is a bipolar transistor having base, collector and emitter terminals, said drain terminal to said collector terminal being connected together and to said voltage multiplier circuit, said source terminal and said emitter terminal being connected together and to said second reference potential line, said gate terminal being connected to said first drive output of said control stage and said base terminal being connected to said second drive output of said control stage.

5. A circuit according to claim 3, wherein said voltage multiplier circuit comprises a transformer having a primary and a secondary windings, said primary winding defining an inductive load connected between said first reference potential line and said first and second electronic devices, said secondary winding having a first winding terminal connected to said second reference potential line and a second winding terminal connected to said control stage and to a blocking capacitor, said transformer having a preset winding ratio and generating at said secondary winding said high voltage output having a value which is at least equal to said first switching on threshold of said first electronic device.

6. A circuit according to claim 3, wherein said control stage defines a supply input connected to said first reference potential line through a first diode, to said high voltage output of said voltage multiplier circuit through a second diode and to a blocking capacitor.

7. A circuit according to claim 4, wherein said control stage comprises at least one comparator having a first comparator input connected to a high voltage output of said voltage multiplier circuit, a second comparator input connected to a first reference voltage and a first comparator output connected, through an inverter, to said base terminal of said bipolar transistor, said comparator output being also connected to a first input of a first AND gate having a second input receiving an enable switching signal and an output connected to said gate terminal of said MOS transistor.

8. A circuit according to claim 7, wherein said control stage further comprises a second comparator having a third comparator input connected to said high voltage output, a fourth comparator input connected to a second reference voltage and a second comparator output connected to an input of a second AND gate having a second input connected to an output of said inverter, said second AND gate having an output connected to a first input of a third AND gate having a second input receiving said enable switching signal, said third AND gate having an output connected to said base terminal of said bipolar transistor.

* * * * *